US007592203B2

(12) United States Patent
Huang et al.

(10) Patent No.: US 7,592,203 B2
(45) Date of Patent: Sep. 22, 2009

(54) METHOD OF MANUFACTURING AN ELECTRONIC PROTECTION DEVICE

(75) Inventors: Chien-Hao Huang, Miaoli (TW); Wen-Chih Li, Miaoli (TW)

(73) Assignee: Inpaq Technology Co., Ltd., Miaoli (TW)

( * ) Notice: Subject to any disclaimer, the term of this patent is extended or adjusted under 35 U.S.C. 154(b) by 467 days.

(21) Appl. No.: 11/641,830

(22) Filed: Dec. 20, 2006

(65) Prior Publication Data

US 2007/0148823 A1 Jun. 28, 2007

(30) Foreign Application Priority Data

Dec. 23, 2005 (TW) .............................. 94222501 U

(51) Int. Cl.
*H01L 21/00* (2006.01)

(52) U.S. Cl. ....................................... 438/113; 438/460

(58) Field of Classification Search ................... 438/33, 438/68, 113, 460; 257/E51.019
See application file for complete search history.

(56) References Cited

U.S. PATENT DOCUMENTS 6,884,646 B1 * 4/2005 Wu et al. ...................... 438/22
7,456,035 B2 * 11/2005 Eliashevich et al. ........... 438/25
6,995,032 B2 * 2/2006 Bruhns et al. ................. 438/33
7,134,943 B2 * 11/2006 Nagai et al. .................... 451/41
7,316,937 B2 * 1/2008 Kojima et al. ................. 438/60
2002/0192927 A1 * 12/2002 Yamada ....................... 438/460
2004/0097012 A1 * 5/2004 Weber et al. ................ 438/113
2005/0199891 A1 * 9/2005 Kunisato et al. .............. 257/85
2007/0072454 A1 * 3/2007 Okamoto et al. .............. 439/86
2008/0265376 A1 * 10/2008 Tsurume et al. ............. 257/618
2009/0032285 A1 * 2/2009 Ueda et al. .................. 174/250

FOREIGN PATENT DOCUMENTS

CN 090104009 2/2001

* cited by examiner

*Primary Examiner*—Thao P. Le
(74) *Attorney, Agent, or Firm*—Volentine & Whitt, PLLC

(57) ABSTRACT

A method of manufacturing an electronic protection device comprises: providing a substrate mother board with a top surface and a bottom surface; forming a first conductive layer and a second conductive layer on the top surface and the bottom surface, respectively; cutting the substrate mother board into a plurality of strip-shaped substrates; and forming insulating layers on surfaces of each of the strip-shaped substrates that are not covered by the first conductive layer and the second conductive layer.

1 Claim, 2 Drawing Sheets

METHOD OF MANUFACTURING AN ELECTRONIC PROTECTION DEVICE

FIELD OF THE INVENTION

The present invention provides a method of manufacturing a miniaturized electronic protection device that is provided with two electrodes on two ends of a substrate that is made of a laminated PPTC material, and the electrodes are formed before a slicing step such that a long side of the protection device is made on the basis of the thickness of the substrate and thereby the size of the protection device is minimized. Additionally, a method for manufacturing the device is provided to simplify a conventional method.

BACKGROUND OF THE INVENTION

A conventional resettable over-current protection device is disclosed in R.O.C. Patent Application No. 090104009 filed by the applicant on 22 Feb. 2001 and entitled "Electrode Structure of a Surface Mount Resettable Over-current Protection Device and Method of Manufacturing the Structure." The method of the ROC Application comprises a step of providing conductive metal foils on the top and bottom surfaces of a PPTC material, a step of etching undesired metal foils on the top and bottom surfaces in the process of etching a PCB to form trenches, forming a main device substrate to be used as a surface mount resettable over-current protection device, coating a main structure of the main device substrate with insulating layers in a screening process, cutting the substrate into a plurality of strip-shaped substrates, forming a plurality of laminated substrate by the strip-shaped substrates, forming end-electrode bottom foil conductors, forming a soldering interface in an electrical plating process so as to finish end-electrode metal structures, and cutting the end-electrode metal structures into dice so as to finish the protection device.

However, the above method cannot reduce the size of the protection device because the end-electrode structures are formed by plating the stropped substrates, which greatly increases the cost of production.

SUMMARY OF THE INVENTION

The present invention provides a method of manufacturing an electronic protection device comprising the following steps:

providing a substrate mother board with a top surface and a bottom surface;

forming a first conductive layer and a second conductive layer on the top surface and the bottom surface, respectively;

cutting the substrate mother board into a plurality of strip-shaped substrates; and forming insulating layers on surfaces of each of the strip-shaped substrates that are not covered by the first conductive layer and the second conductive layer.

DETAILED DESCRIPTION OF THE INVENTION

Figure 2A:
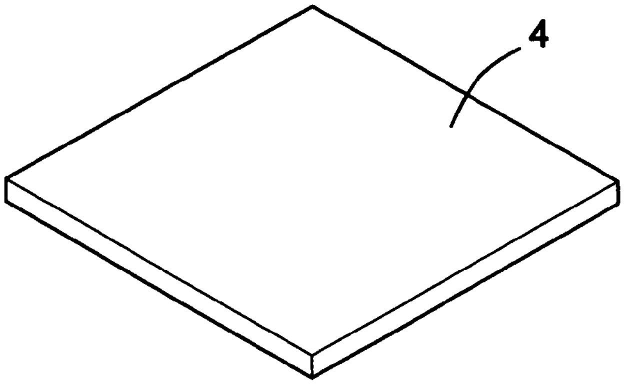
FIG. 2A shows a substrate mother board of a protection device according to an embodiment of the invention.
Figure 2B:
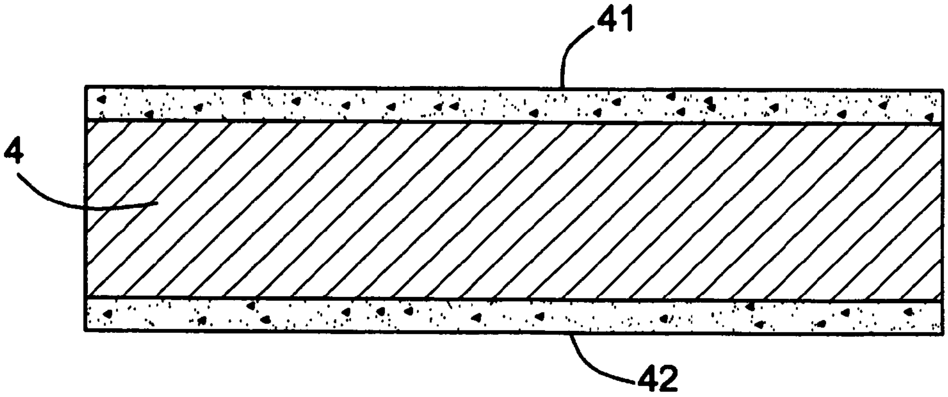
FIG. 2B shows the substrate mother board of FIG. 2A covered by a first conductive layer and a second conductive layer.

FIGS. 2A-2B show a method of manufacturing a protection device according to an embodiment of the invention.

Figure 1:
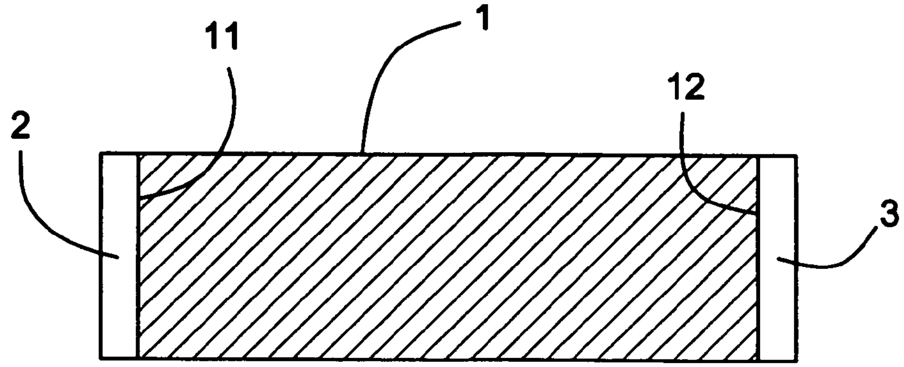
FIG. 1 shows a conventional PPTC protection device.

The present invention relates to a protection device for a miniaturized electronic circuit. With reference to FIG. 1, a substrate 1 is formed by a laminated PPTC material, wherein the substrate is defined by electronic circuits in an etching process or other processes. Two end-electrodes 2, 3 are formed respectively on two sides 11, 12 of the substrate 1.

Shown in FIG. 2A, a substrate mother board 4 is provided according to an embodiment of the invention, wherein the substrate mother board 4 is made of laminated conductive polymer having a positive temperature coefficient. The substrate mother board 4 is etched or defined by other processes to form an electronic circuit. In FIG. 2B, the bottom surface of the substrate mother board 4 is formed with a first conductive layer 41, which may be made of nickel or tin. In FIG. 2B, the top surface of the substrate mother board 4 is formed with a second conductive layer 42, which may be made of nickel or tin.

Figure 2C:
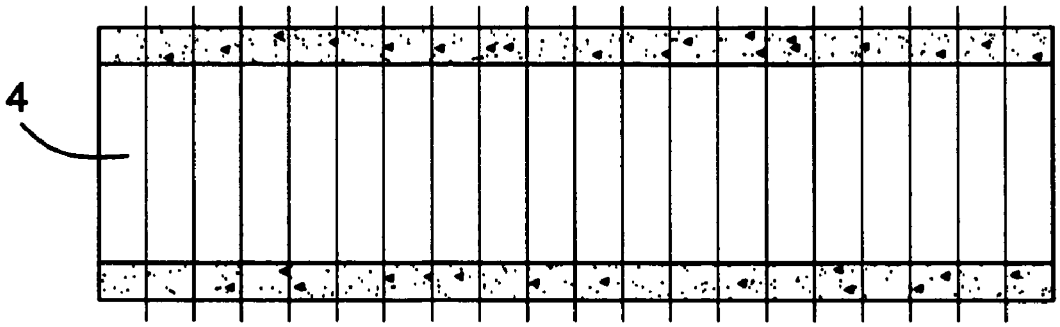
FIG. 2C shows the substrate mother board of FIG. 2B, where cutting lines are formed.

In FIG. 2C, cutting lines for defining protection devices of predetermined sizes are formed on the top surface of the substrate mother board 4. The cutting lines are defined as line X and line Y.

A cutting process or punching process is performed.

Figure 2D:
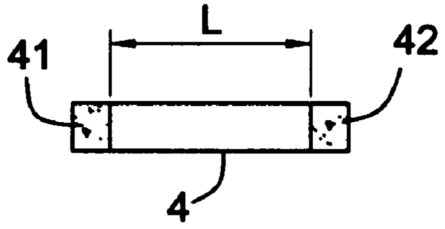
FIG. 2D shows a strip of substrate formed after the substrate mother board is cut.

In FIG. 2D, the protection devices of predetermined sizes are formed.

After the cutting process or punching process, a protection device 5 of predetermined sizes is obtained. The first conductive layer 41 is formed on the first end of the protection device 5 to be an end-electrode and the second conductive layer 42 is formed on the second end of the protection device 5 to be an end-electrode.

When the protection device 5 is formed in predetermined sizes, the first conductive layer 41 and the second conductive layer 42 are formed on the two end surfaces of the protection device 5. Thus, the first conductive layer 41 and the second conductive layer 42 can be directly used as an end electrode, without the need to perform plating processes twice. Therefore, the protection device can be minimized in size, for example, 1 μm by 1 μm. Thus, the protection device can be used in mobile telecommunications apparatuses.

Figure 3:
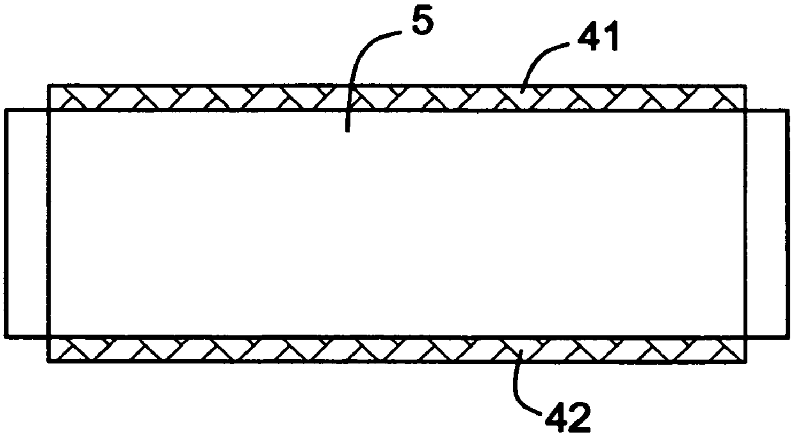
FIG. 3 shows a substrate with insulating layers formed thereon.

As shown in FIG. 3, the first conductive layer 41 and the second conductive layer 42, respectively formed on the top and bottom surfaces of the substrate mother board 4, are formed as end-electrodes. After the cutting or punching process is completed, the predetermined size is achieved. In use, the thickness "H" of the substrate mother board 4 is taken as the length "L" of the protection device. That is to say, the length "L" of the protection device 5 is controlled by the thickness "H" of the substrate mother board 5. Thus, the overall size of the protection device can be minimized so that it can be used in mobile telecommunications apparatuses of reduced sizes.

In FIG. 3, surfaces that are not coated with the end-electrodes are covered by an insulating protective layer 6.

While the invention has been described by way of example and in terms of the preferred embodiments, it is to be understood that the invention is not limited to the disclosed embodiments. On the contrary, it is intended to cover various modifications and similar arrangements that would be apparent to those skilled in the art. Therefore, the scope of the appended claims should be accorded the broadest interpretation so as to encompass all such modifications and similar arrangements.

What is claimed is:

1. A method of manufacturing an electronic protection device, comprising the following steps:

providing a substrate mother board with a top surface and a bottom surface;

forming a first conductive layer and a second conductive layer on the top surface and the bottom surface, respectively;

cutting the substrate mother board into a plurality of strip-shaped substrates; and forming insulating layers on surfaces of each of the strip-shaped substrates that are not covered by the first conductive layer and the second conductive layer.

* * * * *